(12) United States Patent
Furumiya et al.

(10) Patent No.: US 9,123,571 B2
(45) Date of Patent: Sep. 1, 2015

(54) SEMICONDUCTOR DEVICE (71) Applicant: Renesas Electronics Corporation, Kawasaki (JP)

(72) Inventors: Masayuki Furumiya, Kawasaki (JP); Yasutaka Nakashiba, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/137,839

(22) Filed: Dec. 20, 2013

(65) Prior Publication Data
US 2014/0103487 A1 Apr. 17, 2014

Related U.S. Application Data (63) Continuation of application No. 13/671,428, filed on Nov. 7, 2012, now Pat. No. 8,633,037, which is a continuation of application No. 13/064,941, filed on Apr. 27, 2011, now Pat. No. 8,338,193, which is a continuation of application No. 12/591,983, filed on Dec. 7, 2009, now Pat. No. 7,935,549.

(30) Foreign Application Priority Data

Dec. 9, 2008 (JP) .................................. 2008-313316

(51) Int. Cl.
*G01R 31/26* (2014.01)
*H01L 49/02* (2006.01)
(Continued)

(52) U.S. Cl.
CPC ............ *H01L 28/10* (2013.01); *G01R 31/3025* (2013.01); *G01R 31/315* (2013.01);
(Continued)

(58) Field of Classification Search
CPC ................................ H01L 24/06; H01L 28/10
USPC ............................................................ 438/14
See application file for complete search history.

(56) References Cited

U.S. PATENT DOCUMENTS 3,869,251 A 3/1975 Tsantker et al.
4,959,631 A 9/1990 Hasegawa et al.
(Continued)

FOREIGN PATENT DOCUMENTS

JP S62-74940 A 4/1987
JP H11-54322 A 2/1999
(Continued)

OTHER PUBLICATIONS

Notification of Reason(s) for Refusal dated Jul. 2, 2013, with English translation.
(Continued)

*Primary Examiner* — Mohammad Islam
*Assistant Examiner* — Ankush Singal
(74) *Attorney, Agent, or Firm* — McGinn IP Law Group, PLLC (57) ABSTRACT

A semiconductor device, includes a first substrate having a main surface and a rear surface opposing to the main surface, a first circuit including a plurality of transistors formed over the main surface, a first insulating film formed over the main surface to cover the first circuit, a first inductor formed in the first insulating film over the main surface, the first inductor being electrically connected to the first circuit; and a bonding pad formed over the main surface, the bonding pad being located at a first area, the first inductor being located at a second area, the first area being different from the second area in a plan view, and a second substrate having a main surface, a rear surface opposing to the main surface and a second inductor formed over the main surface.

14 Claims, 10 Drawing Sheets (51) Int. Cl.
    *G01R 31/302*     (2006.01)
    *G01R 31/315*     (2006.01)
    *H01L 23/00*     (2006.01)
    *H01L 21/66*     (2006.01)
    *H01L 23/544*     (2006.01)

(52) U.S. Cl.
    CPC ............... *H01L 24/06* (2013.01); *H01L 22/14* (2013.01); *H01L 23/544* (2013.01); *H01L 2223/5446* (2013.01); *H01L 2924/01004* (2013.01); *H01L 2924/01005* (2013.01); *H01L 2924/01006* (2013.01); *H01L 2924/01027* (2013.01); *H01L 2924/01033* (2013.01)

(56) References Cited

U.S. PATENT DOCUMENTS

| | | |
|---|---|---|
| 5,481,131 A | 1/1996 | Staudinger et al. |
| 5,834,825 A | 11/1998 | Imai |
| 5,936,299 A | 8/1999 | Burghartz et al. |
| 6,039,014 A | 3/2000 | Hoppie |
| 6,255,714 B1 | 7/2001 | Kossives et al. |
| 6,262,468 B1 | 7/2001 | Imam et al. |
| 6,437,409 B2 | 8/2002 | Fujii |
| 6,515,568 B1 | 2/2003 | Maki et al. |
| 6,838,885 B2 | 1/2005 | Kamitani |
| 6,859,994 B2 | 3/2005 | Oshima et al. |
| 7,053,165 B2 | 5/2006 | Furumiya et al. |
| 7,064,643 B2 | 6/2006 | Matsutani et al. |
| 7,146,861 B1 | 12/2006 | Cook et al. |
| 7,183,624 B2 | 2/2007 | Ipposhi |
| 7,332,793 B2 | 2/2008 | Ipposhi |
| 7,982,574 B2 | 7/2011 | Gardner |
| 7,999,386 B2 | 8/2011 | Uchida et al. |
| 8,421,188 B2 | 4/2013 | Uchida et al. |
| 2001/0013821 A1 | 8/2001 | Huang et al. |
| 2002/0064922 A1 | 5/2002 | Lin |
| 2003/0020137 A1 | 1/2003 | Bosco et al. |
| 2003/0075776 A1 | 4/2003 | Ohkubo et al. |
| 2003/0122648 A1 | 7/2003 | Ou et al. |
| 2003/0193743 A1 | 10/2003 | Sasaki et al. |
| 2003/0210033 A1 | 11/2003 | Strid et al. |
| 2004/0004255 A1 | 1/2004 | Yoshimura |
| 2004/0004525 A1* | 1/2004 | Rittner et al. ................ 336/200 |
| 2004/0032011 A1 | 2/2004 | Warner et al. |
| 2004/0232554 A1 | 11/2004 | Hirano et al. |
| 2005/0133496 A1 | 6/2005 | Thomasset |
| 2005/0232664 A1 | 10/2005 | Tomita |
| 2005/0275497 A1 | 12/2005 | Ramadan et al. |
| 2006/0038454 A1 | 2/2006 | Bojiuc |
| 2006/0152323 A1 | 7/2006 | Pavier |
| 2006/0157798 A1 | 7/2006 | Hayashi et al. |
| 2006/0214677 A1 | 9/2006 | Hayden et al. |
| 2006/0228589 A1 | 10/2006 | Choi et al. |
| 2007/0138557 A1 | 6/2007 | Ipposhi |
| 2007/0188287 A1 | 8/2007 | Lien et al. |
| 2008/0041551 A1 | 2/2008 | Collette et al. |
| 2008/0116997 A1 | 5/2008 | Dabney et al. |
| 2009/0072388 A1 | 3/2009 | Tews et al. |
| 2009/0140359 A1* | 6/2009 | Nakashiba .................... 257/428 |
| 2009/0181473 A1 | 7/2009 | Smeys et al. |
| 2009/0243780 A1 | 10/2009 | Inoue et al. |
| 2011/0316118 A1 | 12/2011 | Uchida et al. |

FOREIGN PATENT DOCUMENTS

| | | |
|---|---|---|
| JP | 2003-344448 | 12/2003 |
| JP | 2005-30877 | 2/2005 |
| WO | WO 02/063675 A1 | 8/2002 |
| WO | WO 2004/061876 A1 | 7/2004 |
| WO | WO 2007/146582 A2 | 12/2007 |

OTHER PUBLICATIONS

Notification of Reason(s) for Refusal dated May 13, 2014, with English translation.
Japanese Office Action dated Feb. 3, 2015 with an English Translation thereof.

* cited by examiner

SEMICONDUCTOR DEVICE

The present application is a Continuation Application of U.S. patent application Ser. No. 13/671,428, filed on Nov. 7, 2012, which is a Continuation Application of U.S. patent application Ser. No. 13/064,941, filed on Apr. 27, 2011, now U.S. Pat. No. 8,338,193, which is a Continuation Application of U.S. patent application Ser. No. 12/591,983, now U.S. Pat. No. 7,935,549, which are based on and claim priority from Japanese patent application No. 2008-313316, filed on Dec. 9, 2008, the entire contents of which are incorporated herein by reference.

BACKGROUND OF THE INVENTION

The present invention relates to a signal transmitting/receiving method, a semiconductor device manufacturing method, a semiconductor device, and a tester.

In order to test an internal circuit of the semiconductor device in its wafer state, there have been attempts to probe a pad on a chip surface of the semiconductor device for supplying an electric power or to transmit and receive signals for observation. Such techniques have been disclosed in the following Patent Documents.

Japanese Patent Laid-Open No. 2005-30877 discloses a technique for performing a test by mounting a test circuit and a wireless communication circuit in a semiconductor integrated circuit device, and using wireless signals to control the test circuit.

Japanese Patent Laid-Open No. 2003-344448 discloses a voltage probe chip having a sensor electrode which is disposed facing a signal line to be monitored on a semiconductor chip so as to detect a voltage change of the signal line as an induced voltage caused by electrostatic induction.

However, the inventors have found the following problems. There are problems in that the pad is damaged by a tester needle during a probe test, causing a connection failure later when the pad is bonded, or the pad is scratched to generate scrap materials causing contamination, and the like. There is another problem in that the more the chip size is reduced and the more the number of pads per chip is increased, the more the pad size and the inter-pad pitch is reduced, and thereby the more difficult it is to provide a well electrical connection by contacting a large number of probe needles corresponding to a large number of pads. In order to prevent such problems, it is preferable to transmit and receive signals to and from the internal circuit without using the probe needles.

However, in order to obtain signals having intensity enough to transmit and receive the signals by electromagnetic induction using an inductor, it is necessary to increase the inductor size, which increases the area necessary to provide the inductors. In particular, in order to provide a large number of inductors corresponding to a large number of pads, the area necessary to provide the inductors is greatly increased.

SUMMARY

The present invention provides a semiconductor device, comprising:
a first substrate having a main surface and a rear surface opposing to the main surface;
a first circuit including a plurality of transistors formed over the main surface;
a first insulating film formed over the main surface to cover the first circuit;
a first inductor formed in the first insulating film over the main surface, the first inductor being electrically connected to the first circuit; a bonding pad formed over the main surface, the bonding pad being located at a first area, the first inductor being located at a second area, the first area being different from the second area in a plan view, a second substrate having a main surface, a rear surface opposing to the main surface and a second inductor formed over the main surface, the second inductor being capable of outputting a predetermined signal; wherein the first substrate and the second substrate are disposed such that the first inductor and the second inductor are overlapped with each other in the plan view and are adhered to each other by a tape material therebetween, and wherein the first inductor and the second inductor perform communication with each other in contactless manner.

Further, the present invention provides a semiconductor device manufacturing method comprising: disposing a semiconductor device which includes a first insulating film which includes a transistor on a substrate and a second insulating film which is provided on the first insulating film and includes an inductor and an external device which includes an external inductor provided in a position corresponding to the inductor of the semiconductor device so as to face each other; and disposing a ferromagnetic film which includes ferromagnetic fine particles at least between the inductor of the semiconductor device and the external inductor of the external device; and disposing the inductor and the external inductor so as to face each other via the ferromagnetic film therebetween; and in a state in which the inductor and the external inductor are made to face each other, transmitting and receiving signals between the inductor and the external inductor by electromagnetic induction.

This configuration can maintain as small an area as necessary to provide the inductors and can well transmit and receive signals by electromagnetic induction.

The above configuration can increase the inductor coupling factor between the inductors formed in the semiconductor device and the external inductors when signals are transmitted and received therebetween by electromagnetic induction. Thereby, this configuration allows an inductor with a smaller size to well transmit and receive signals by electromagnetic induction. For this reason, this configuration can maintain as small an area as necessary to provide the inductors and can well transmit and receive signals by electromagnetic induction.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Hereinafter, embodiments of the present invention will be described by referring to drawings. Note that throughout the drawings, like reference characters refer to like elements and the duplicate description is omitted as needed. In the present embodiment, assuming that the external device is a tester, the following description will use an example in which when a test is conducted on an internal circuit in a chip forming region of the semiconductor device in its wafer state, various test signals are transmitted and received to and from the tester by electromagnetic induction.

Figure 1A:
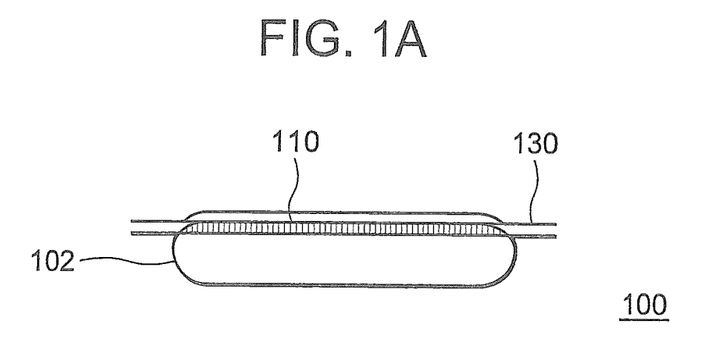
FIGS. 1A to 1C each is a process cross-sectional view illustrating a procedure for manufacturing a semiconductor device in accordance with an embodiment of the present invention.
Figure 1B:
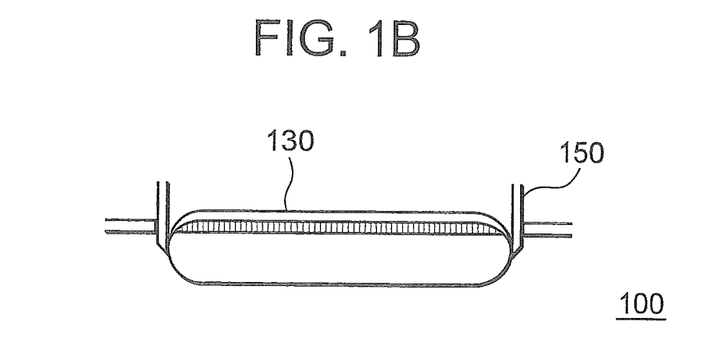
Figure 1C:
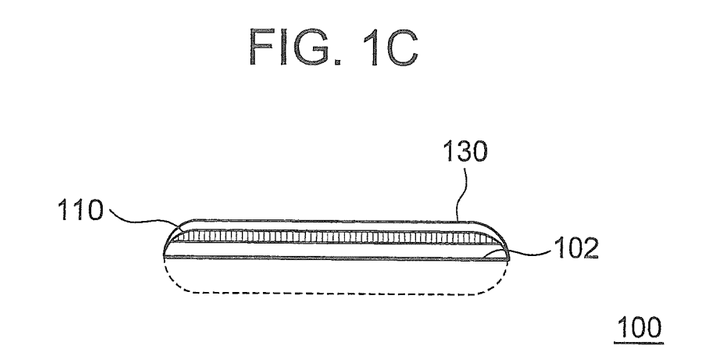

FIGS. 1 and 2 each is a process cross-sectional view illustrating a procedure for manufacturing a semiconductor device in accordance with an embodiment of the present invention.

The semiconductor device 100 includes a substrate 102 (wafer). According to the present embodiment, an inductor forming region 110 in which a plurality of inductors are formed is provided on one surface of the substrate 102. Signals are transmitted and received between the above configured semiconductor device 100 and a tester 200 which includes a plurality of external inductors each of which is provided in a position corresponding to each inductor in the semiconductor device 100, and transmits and receives the signals by electromagnetic induction.

Figure 3:
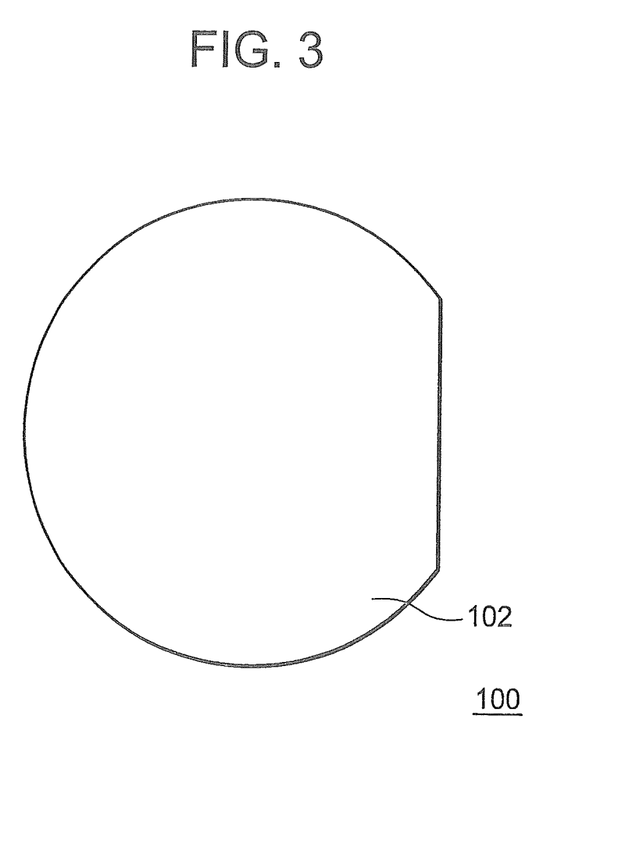
FIG. 3 is a plan view of the substrate illustrated in FIG. 1.
Figure 4:
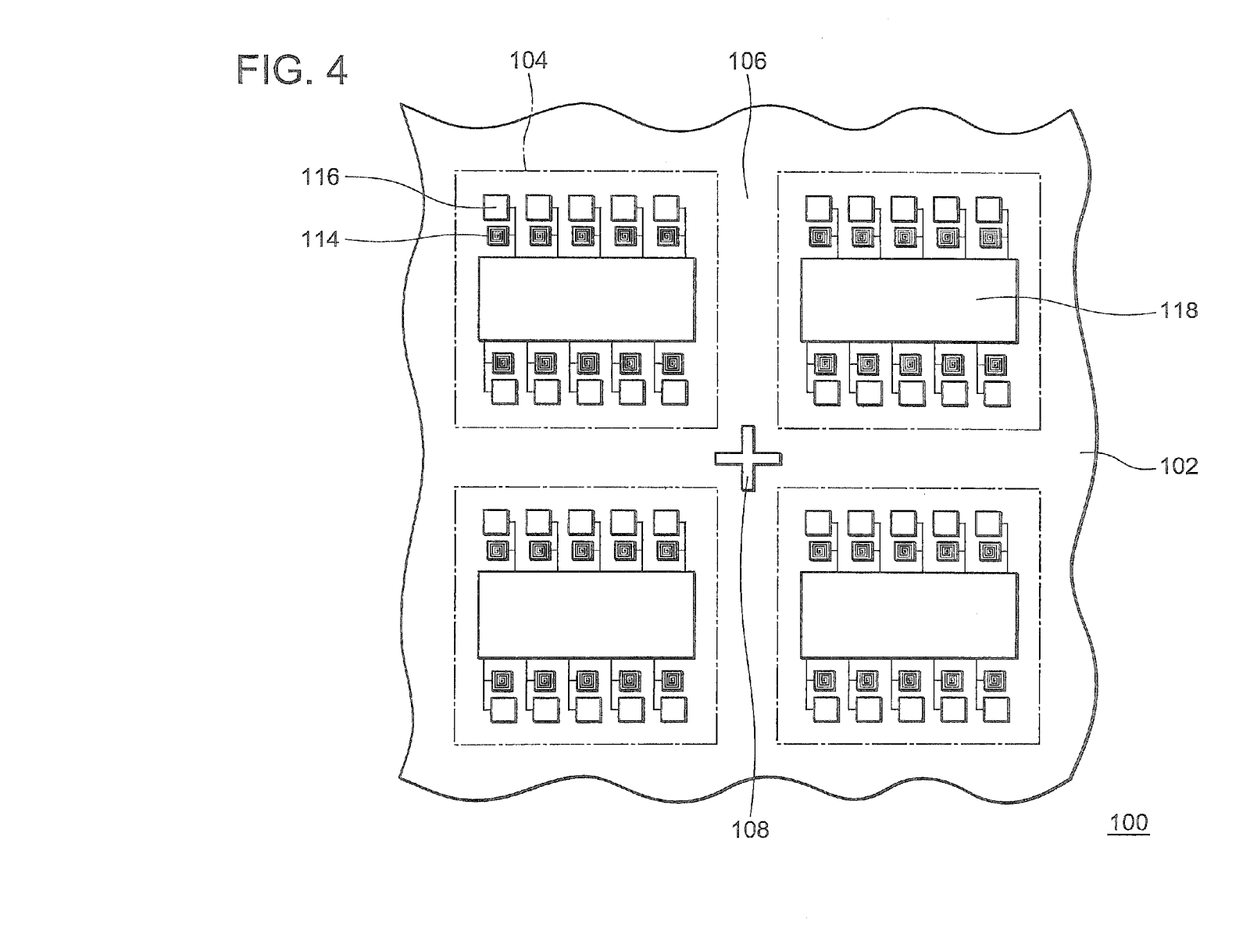
FIG. 4 is an enlarged view of FIG. 3.

FIG. 3 is a plan view of the substrate 102 illustrated in FIG. 1. FIG. 4 is an enlarged view of FIG. 3. FIG. 3 illustrates only the outer edge of the substrate 102. As illustrated in FIG. 4, the one surface of the substrate 102 includes a plurality of semiconductor chip forming regions 104 and scribe line regions 106 each of which is provided on the outer circumference of a semiconductor chip forming region 104. FIG. 4 illustrates four semiconductor chip forming regions 104 and an alignment mark 108 between them in the scribe line region 106. The semiconductor chip forming region 104 is a region which will be a semiconductor chip after dicing.

An internal circuit 118, a plurality of inductors 114, and a plurality of bonding pads 116 are provided in each semiconductor chip forming region 104 of the semiconductor device 100. The bonding pad 116 is a pad on which wire bonding is performed later. The bonding pad 116 is wire-connected to the internal circuit 118, the wire of which is connected to the inductors 114. The inductor 114 can be provided as an alternative to the pad provided for probing when a test is performed on an internal circuit of a conventional semiconductor device in its wafer level. The inductor 114 may be provided or may not be provided in all the wires connecting between the bonding pad 116 and the internal circuit 118. In addition, although not illustrated, the semiconductor device 100 includes a plurality of conversion circuits provided corresponding to each inductor 114. Moreover, although not illustrated, the semiconductor device 100 can include a power circuit.

Note that the inductors 114 are provided on the surface of the semiconductor device 100 so as to transmit and receive signals to and from an external device. In addition, the bonding pads 116 are also provided on the surface of the semiconductor device 100 so as to perform wire bonding later. Note that the surface of the inductor 114 may be covered with a film such as a passivation film to such an extent that the film does not affect the process of transmitting and receiving signals by electromagnetic induction. Moreover, the bonding pad 116 is formed in a region not to interrupt communication between the inductors 114 and the external device. Here, the region not to interrupt communication indicates a case in which the inductor 114 and the bonding pad 116 are formed in a different region when viewed from above in FIG. 4. Note that the inductor 114 and the bonding pad 116 shall be slightly overlapped.

On the other hand, the conversion circuit serves only to convert the signals that the inductors 114 transmit and receive to and from the external device, and thus needs not be provided on the surface of the semiconductor device 100. For this reason, the conversion circuits can be provided so as to be overlapped with the inductors 114 in the laminating direction of the semiconductor substrate, and thus can suppress an increase in size of the semiconductor device 100. For example, each conversion circuit is provided in a layer under its corresponding inductor 114. Each inductor 114 is electrically connected to the internal circuit 118 via its corresponding conversion circuit. The conversion circuit performs modulation and demodulation on the signals transmitted and received between the internal circuit 118 and the external device. In addition, each bonding pad 116 is also electrically connected to the internal circuit 118.

Although not illustrated here, the internal circuit 118 can include a plurality of transistors corresponding to the plurality of inductors 114. One end of each of the source and the drain of a transistor is connected to ground and the other end thereof is connected to a power circuit via a power supply line. In addition, the gate of each transistor is connected to each inductor 114 via each conversion circuit. Further, the gate of each transistor is also connected to each bonding pad 116. Note that a configuration may be made such that an I/O buffer circuit is included between the transistor, the bonding pad 116, and the conversion circuit.

Now, going back to FIGS. 1 and 2, the description continues with the procedure for manufacturing the semiconductor device in accordance with the present embodiment.

As illustrated in FIG. 1A, the ferromagnetic film 130 is formed on the inductor forming region 110 formed on one surface of the substrate 102 of the semiconductor device 100 described above. The ferromagnetic film 130 can be a tape containing ferromagnetic fine particles in an insulating film (polymer) such as polyester. Here, the ferromagnet can be a metal such as Fe, Co, and Ni or their alloy. The ferromagnetic film 130 can be about as thick as from 20 μm to 0.25 mm. The ferromagnetic film 130 can be formed on the semiconductor device 100, for example, in the following procedure. First, an adhesive such as a water-soluble glue is applied to the entire surface of the ferromagnetic film 130, and the ferromagnetic film 130 is disposed in such a manner that the one surface on which the adhesive is applied is in contact with the one surface of the substrate 102 on which the inductor forming region 110 is formed. Then, the ferromagnetic film 130 is pressed and adhered onto the inductor forming region 110 by a roller (not illustrated) or the like.

Then, for example, the ferromagnetic film 130 is cut along the circumferential portion of the substrate 102 by contacting the cutter 150, which is a circumferential cutter, against the edge of the substrate 102. Thereby, the ferromagnetic film 130 having the same size of the substrate 102 can be formed on the substrate 102 (FIG. 1B).

Next, the bottom surface opposite to the one surface of the substrate 102 is ground by a machine such as a back grinder to form the substrate 102 having a predetermined thickness. For example, the thickness of the substrate 102 can be about from 200 μm to 400 μm (FIG. 1C).

Subsequently, signals are transmitted and received between external inductors of the tester 200 and inductors in the inductor forming region 110 of the semiconductor device 100. According to the present embodiment, the tester 200 includes a plurality of test chips 201 (chips for performing a test). Each test chip 201 is formed to a size corresponding to each semiconductor chip forming region 104 of the semiconductor device 100.

First, the semiconductor device 100 is mounted on a mounting base 152, and the tester 200 is placed closer to the semiconductor device 100. Then, signals are transmitted and received between the external inductors of the tester 200 and the inductors in the inductor forming region 110 of the semiconductor device 100 (FIG. 2A and FIG. 2B).

Figure 2A:
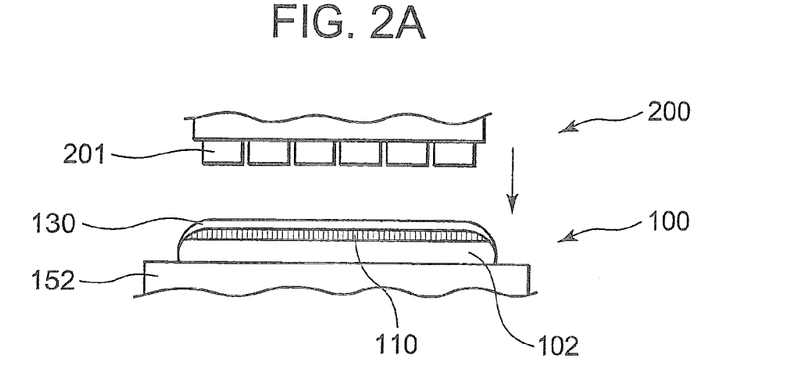
FIGS. 2A to 2D each is a process cross-sectional view illustrating a procedure for manufacturing a semiconductor device in accordance with an embodiment of the present invention.
Figure 2B:
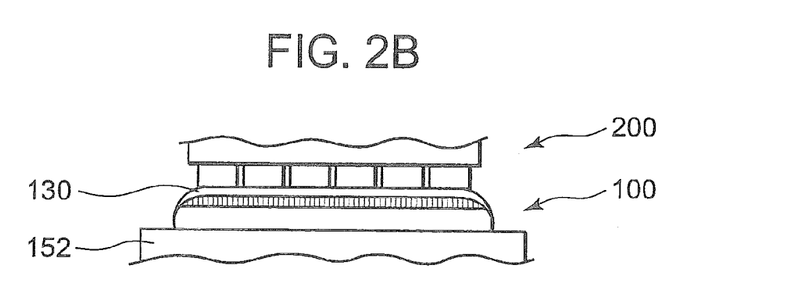
Figure 5:
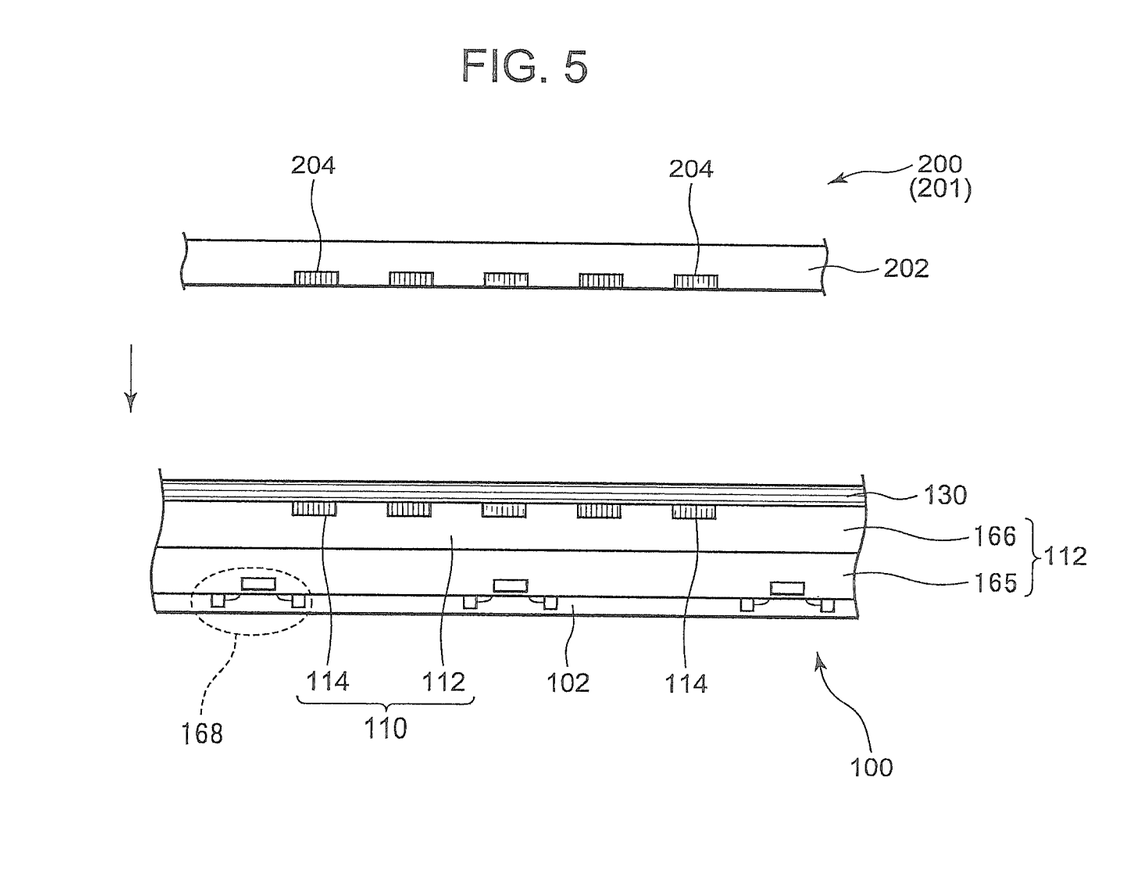
FIG. 5 is an enlarged sectional view of FIG. 2A.
Figure 6:
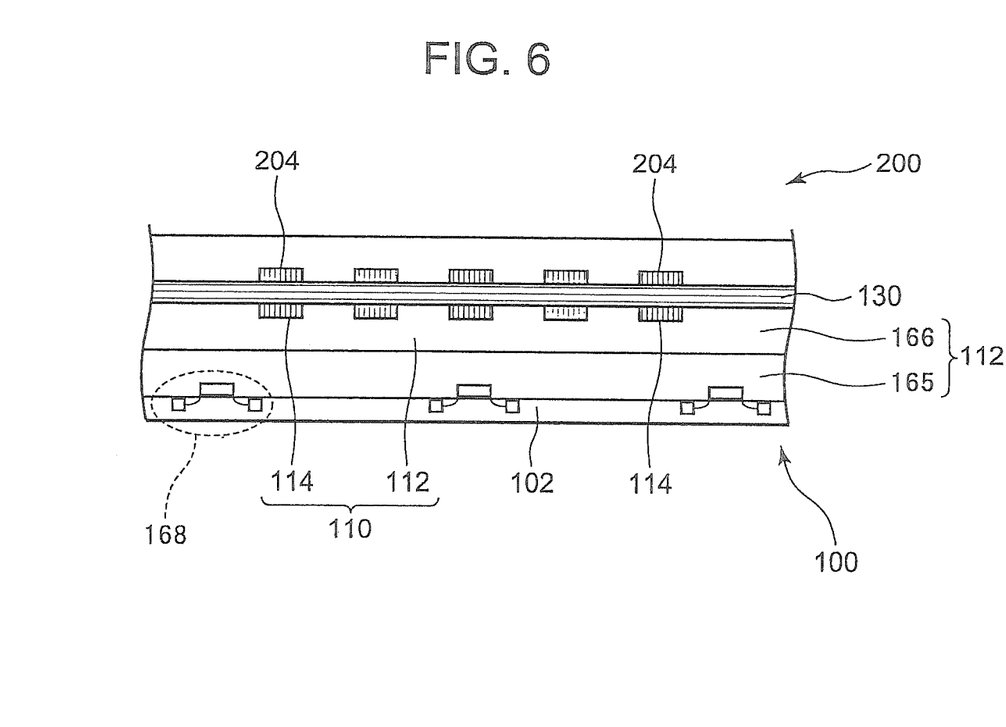
FIG. 6 is an enlarged sectional view of FIG. 2B.

FIG. 5 and FIG. 6 each is an enlarged sectional view of FIG. 2A and FIG. 2B respectively. Here, each figure partially illustrates one of the semiconductor chip forming region 104 (see FIG. 4) of the semiconductor device 100 and one of the test chips 201 of the tester 200.

The inductor forming region 110 of the semiconductor device 100 has an insulating film 112 provided on the substrate 102 and a plurality of inductors 114 provided on one surface of the insulating film 112 opposite to a surface facing the substrate 102. In addition, although not illustrated, the bonding pads 116 are also provided on one surface of the insulating film 112. That is, according to the present embodiment, the ferromagnetic film 130 is also provided on the bonding pads 116. The test chip 201 of the tester 200 includes a test substrate 202 and a plurality of external inductors 204 each provided in a position corresponding to the plurality of inductors 114 of the semiconductor device 100.

Here, the insulating film 112 includes an insulating layer 165 which includes transistors 168 constituting circuits such as an internal circuit, a conversion circuit, and a power circuit; and an insulating layer 166 which mainly includes wires. Both insulating layers 165 and 166 may be formed of a plurality of insulating films and each insulating layer has wires required for circuit configuration therein. The inductor 114 is formed in the uppermost surface layer of the insulating layer 166; and the bonding pad 116 is formed in the uppermost surface layer of the insulating layer 166 or on the insulating layer 166, for example.

First, the tester 200 is placed closer to the semiconductor device 100 in such a manner that each external inductor 204 of the tester 200 faces each inductor 114 of the semiconductor device 100. At this time, the ferromagnetic film 130 is disposed between each inductor 114 of the semiconductor device 100 and each external inductor 204 of the tester 200; and each inductor 114 and each external inductor 204 are disposed facing each other via the ferromagnetic film 130 therebetween. Moreover, here, each inductor 114 and each external inductor 204 can be disposed facing each other in contact with the ferromagnetic film 130. Here, the ferromagnetic film 130 can also be made to function as a cushioning material. Moreover, the ferromagnetic film 130 can be configured to have an approximately equal film thickness entirely. By doing so, each inductor 114 and each external inductor 204 can be stably spaced at constant intervals.

In this state, a radio wave having a predetermined frequency is outputted from each external inductor 204 of the tester 200 to the semiconductor device 100. Here, a test signal and the like are outputted from the external inductor 204.

The inductor 114 of the semiconductor device 100 converts the signal outputted from the external inductor 204 to an AC electrical signal. The conversion circuit demodulates the AC electrical signal converted by the inductor 114 and supplies it to the internal circuit 118. On the other hand, when a signal is outputted from the semiconductor device 100 to the tester 200, the conversion circuit modulates the electrical signal supplied from the internal circuit 118 and supplies it to the inductor 114. The inductor 114 outputs the modulated signal as a radio wave to the corresponding external inductor 204 of the tester 200. In this manner, signals are transmitted and received between the semiconductor device 100 and the tester 200.

Figure 2C:
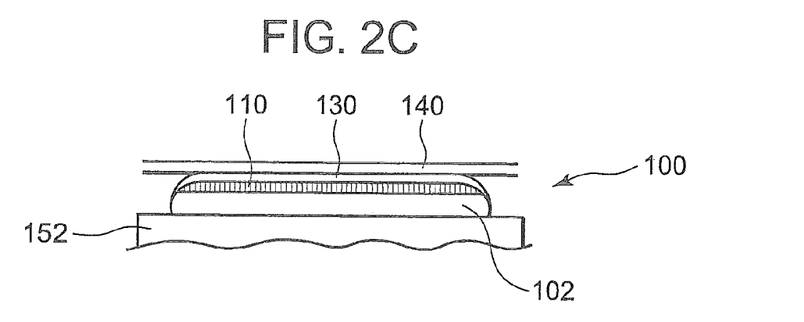
Figure 2D:
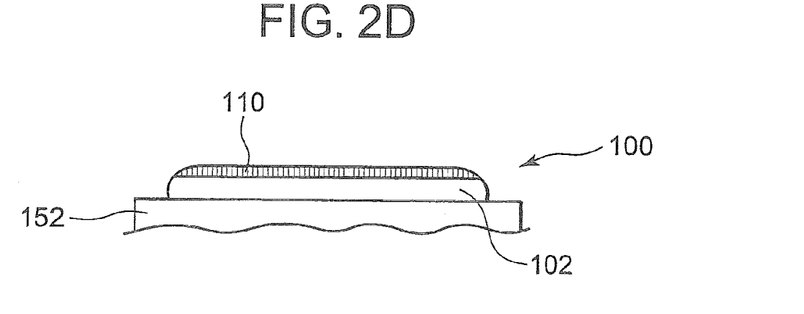

After the process of transmitting and receiving signals between the semiconductor device 100 and the tester 200 is completed, the ferromagnetic film 130 is removed. The process of removing the ferromagnetic film 130 can be performed in the following procedure. First, in a tape peeling device (not illustrated), the substrate 102 of the semiconductor device 100 is fixed by a vacuum chuck. In this state, a peeling tape 140 is placed in contact on the ferromagnetic film 130 so as to peel the ferromagnetic film 130 (FIG. 2C). Then, the peeling tape 140 is peeled off from the semiconductor device 100 together with the ferromagnetic film 130 (FIG. 2D). Subsequently, pure water, an organic solvent, or the like is used to clean the semiconductor device 100 and dry it. Thus, the above process completes the wafer test.

Subsequently, for example, the semiconductor device 100 is cut along the scribe line region 106 to make each semiconductor chip forming region 104 into a chip. Then, a semiconductor chip can be formed by connecting each bonding pad 116 of the each semiconductor chip forming region 104 to an external terminal with a bonding wire, or the like.

According to the present embodiment, when signals are transmitted and received between the external inductors 204 of the tester 200 and the inductors 114 of the semiconductor device 100 by electromagnetic induction, the bonding pad is provided in a region not to interrupt the communication to and from the external device, and thus can increase the inductor coupling factor therebetween. The inductor coupling factor can further increase by placing the ferromagnetic film 130 between the external inductors 204 and the inductors 114 of the semiconductor device 100. Thereby, this configuration allows an inductor with a smaller size to well transmit and receive signals by electromagnetic induction. For this reason, this configuration can maintain as small an area as necessary to provide the inductors and can well transmit and receive signals by electromagnetic induction.

Moreover, the ferromagnetic film 130 can also be made to function as a cushioning material. Therefore, the external inductors 204 of the tester 200 and the inductors 114 of the semiconductor device 100 can be placed in contact with the ferromagnetic film 130. By doing so, each inductor 114 and each external inductor 204 can be stably spaced at constant intervals.

Second Embodiment

According to the present embodiment, a configuration may be made in such a manner that after the process of transmitting and receiving the signals is completed, the ferromagnetic film 130 remains partially on the semiconductor device 100.

Figure 7:
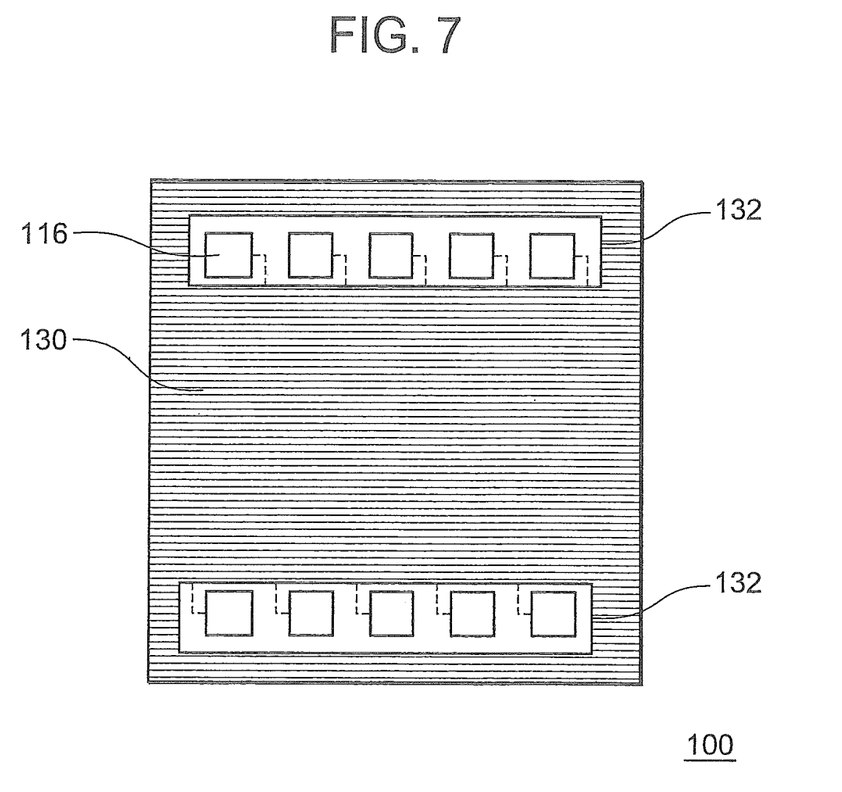
FIG. 7 is a plan view illustrating an example of a semiconductor chip forming region of the semiconductor device in accordance with an embodiment of the present invention.

FIG. 7 is a plan view illustrating an example of the semiconductor chip forming region 104 (see FIG. 4) of the semiconductor device 100 in accordance with the present embodiment. In this example, the ferromagnetic film 130 is not formed selectively only on a region of the semiconductor device 100 where the bonding pads 116 are formed. For example, the ferromagnetic film 130 can be configured to have an opening portion 132 so as to expose the bonding pads 116. By doing so, each bonding pad 116 can be connected to an external terminal with a bonding wire with the ferromagnetic film 130 left as is.

Thus configured ferromagnetic film 130 can be obtained in such a manner that for example, after the ferromagnetic film 130 is formed on the entire surface of the semiconductor device 100, the ferromagnetic film 130 is removed selectively to form the opening portion 132. The selective removal of the ferromagnetic film 130 can be performed, for example, by wet etching using photoresist as a mask. Here, for example, the ferromagnetic film 130 can be formed in such a manner that after a multi-layered structure of the semiconductor device is formed, a ferromagnet is mixed into a passivation film formed on the upper surface thereof. In this case, the selective removal of the ferromagnetic film 130 can be performed, for example, by wet etching using photoresist as a mask. The selective removal of the ferromagnetic film 130 may be performed either before or after signals are transmitted and received between the external inductors 204 of the tester 200 and the inductors 114 of the semiconductor device 100.

Figure 8:
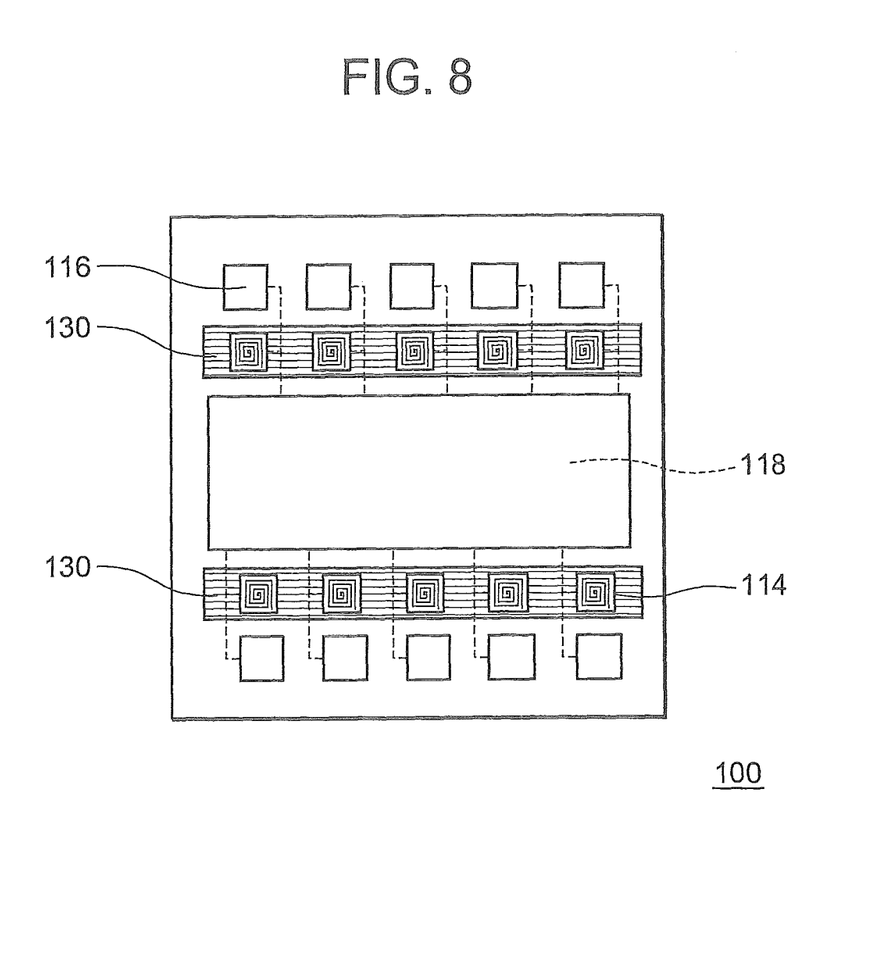
FIG. 8 is a plan view illustrating another example of the semiconductor chip forming region of the semiconductor device in accordance with an embodiment of the present invention.

FIG. 8 is a plan view illustrating another example of the semiconductor chip forming region 104 (see FIG. 4) of the semiconductor device 100 in accordance with the present embodiment. In this example, the ferromagnetic film 130 is formed selectively only on a region of the semiconductor device 100 where the inductors 114 are formed. Note that here, for the purpose of the description, the inductors 114 are also illustrated, but actually the inductors 114 are covered with the ferromagnetic film 130. Such a configuration also allows the bonding pads 116 to be exposed, and thus each bonding pad 116 can be connected to an external terminal with a bonding wire with the ferromagnetic film 130 left as is.

Thus configured ferromagnetic film 130 can be obtained in such a manner that for example, after the ferromagnetic film 130 is formed on the entire surface of the semiconductor device 100, the ferromagnetic film 130 is removed selectively. In this case, the selective removal of the ferromagnetic film 130 can also be performed, for example, by wet etching using photoresist as a mask. Here, for example, the ferromagnetic film 130 can be formed in such a manner that after a multi-layered structure of the semiconductor device is formed, a ferromagnet is mixed into a passivation film formed on the upper surface thereof. In this case, the selective removal of the ferromagnetic film 130 can also be performed, for example, by wet etching using photoresist as a mask. The selective removal of the ferromagnetic film 130 may be performed either before or after signals are transmitted and received between the external inductors 204 of the tester 200 and the inductors 114 of the semiconductor device 100.

The present embodiment can also provide the same effect as the first embodiment.

Third Embodiment

According to the present embodiment, the ferromagnetic film 130 can be configured to be provided on the tester 200 side.

Figure 9:
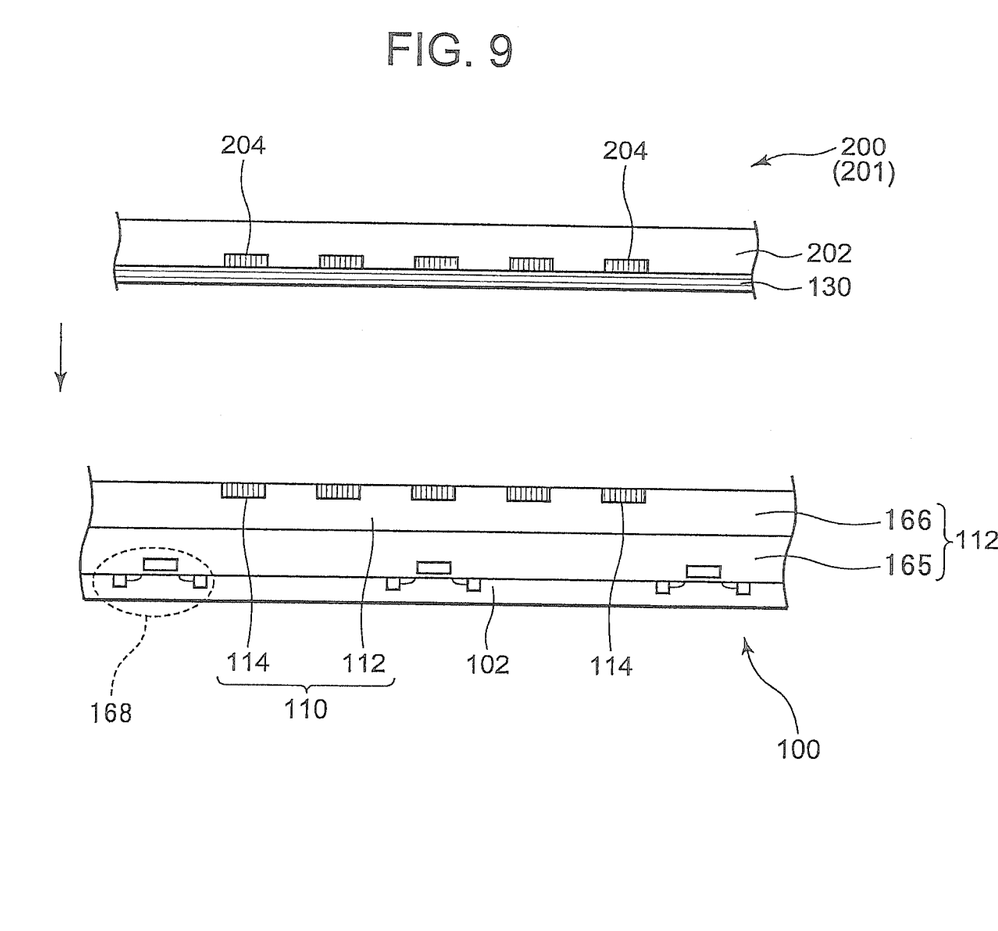
FIG. 9 is a sectional view illustrating a configuration of a tester in accordance with an embodiment of the present invention.

FIG. 9 is a sectional view illustrating a configuration of the tester 200 in accordance with present embodiment. Here, the tester 200 includes the ferromagnetic film 130 formed on the surface of the external inductors 204. Such a configuration can also provide the same effect as the first embodiment and the second embodiment. Alternatively, a configuration may be made such that two ferromagnetic films 130 are provided one on the tester 200 side and one on the semiconductor device 100 side.

Hereinbefore, the embodiments of the present invention have been described by referring to drawings, but these embodiments are examples of the present invention and various configurations other than the above can be adopted.

Figure 10:
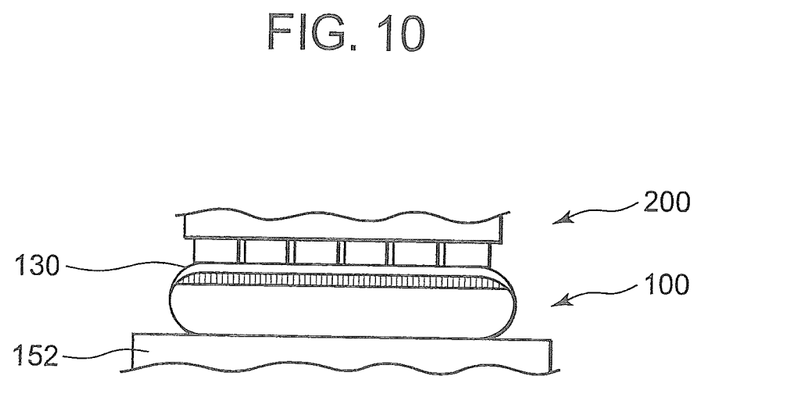
FIG. 10 is a sectional view illustrating another example of the semiconductor device in accordance with an embodiment of the present invention.

In the above embodiments, the procedure for grinding the bottom surface of the substrate 102 described by referring to FIG. 1C may be omitted. FIG. 10 is a sectional view illustrating the semiconductor device 100 corresponding to FIG. 2B in this case. In this case, like the one illustrated in FIG. 2, signals can also be transmitted and received between the semiconductor device 100 and the tester 200.

Further, the above embodiments have illustrated the example in which the tester 200 has a plurality of test chips 201 corresponding to the number of semiconductor chip forming regions 104 of the semiconductor device 100, but the tester 200 may be configured to include the number of test chips 201 corresponding to only a part of the semiconductor chip forming regions 104 of the semiconductor device 100. In this case, a test can be performed in series on each semiconductor chip forming region 104 of the semiconductor device 100 by shifting the tester 200.

Moreover, the above embodiments have illustrated the example in which the test is performed on the internal circuit of the chip forming region of the semiconductor device in its wafer state. However, the present invention can be applied to an example in which after the chip forming region is cut into a chip, a test is performed on the internal circuit for each semiconductor chip.

Further, the ferromagnetic film 130 can be used as an independent sheet without being formed on the semiconductor device 100 or on the tester 200. In this case, when signals are transmitted and received between the semiconductor device 100 and the tester 200 by electromagnetic induction, the ferromagnetic film 130 can be disposed between the inductors 114 of the semiconductor device 100 and the external inductors 204 of the tester 200.

It is apparent that the present invention is not limited to the above embodiments and descriptions, but may be modified and changed without departing from the scopes and sprits.

What is claimed is:

1. A semiconductor device, comprising:
   a first substrate including a main surface and a rear surface opposing to the main surface;
   a first circuit including a plurality of transistors formed over the main surface;
   a first insulating film formed over the main surface to cover the first circuit;
   a first inductor formed in the first insulating film over the main surface, the first inductor being electrically connected to the first circuit;

a bonding pad formed over the main surface, the bonding pad being located at a first area, the first inductor being located at a second area, the first area being different from the second area in a plan view, a second substrate including a main surface, a rear surface opposing to the main surface and a second inductor formed over the main surface, the second inductor being capable of outputting a predetermined signal, wherein the first substrate and the second substrate are disposed such that the first inductor and the second inductor are overlapped with each other in the plan view and are adhered to each other by a tape material therebetween, and wherein the first inductor and the second inductor perform communication with each other in contactless manner.

2. The semiconductor device according to claim 1, wherein the bonding pad is located at a region where the tape material is not formed.

3. The semiconductor device according to claim 1, wherein the tape material is formed between the first and second inductors.

4. The semiconductor device according to claim 1, further including a bonding wire, wherein the bonding wire is connected with the bonding pad.

5. A semiconductor device, comprising:
a first substrate including a main surface and a rear surface opposing to the main surface;
a first circuit including a plurality of transistors formed over the main surface; a first insulating film formed over the main surface to cover the first circuit;
a first inductor formed in the first insulating film over the main surface, the first inductor electrically communicating with the first circuit;
a bonding pad formed over the main surface;
a second substrate including a main surface, a rear surface opposing to the main surface and a second inductor formed over the main surface, the second inductor being capable of outputting a predetermined signal, wherein the first inductor and the second inductor perform communication with each other in contactless manner;
wherein the first substrate and the second substrate are disposed such that the first inductor and the second inductor are overlapped with each other in the plan view and are adhered to each other by a tape material therebetween.

6. The semiconductor device according to claim 5, wherein the bonding pad is located at a first area, the first inductor is located at a second area, the first area being different from the second area in a plan view.

7. The semiconductor device according to claim 5, wherein the bonding pad is located at a region where the tape material is not formed.

8. The semiconductor device according to claim 5, wherein the tape material is formed between the first and second inductors.

9. The semiconductor device according to claim 5, further including a bonding wire, wherein the bonding wire is connected with the bonding pad.

10. A semiconductor device, comprising:
a first substrate;
a first circuit including a plurality of transistors formed over the first substrate;
a first insulating film formed over the first substrate to cover the first circuit;
a first inductor formed in the first insulating film over the first substrate, the first inductor being electrically connected to the first circuit;
a bonding pad formed over the first substrate, the bonding pad being located at a first area, the first inductor being located at a second area, the first area being different from the second area, a second substrate;
a second inductor formed over the second substrate, the second inductor being capable of outputting a predetermined signal, wherein the first inductor and the second inductor perform communication with each other in contactless manner;
wherein the first substrate and the second substrate are disposed such that the first inductor and the second inductor are overlapped with each other and are adhered to each other by a tape material therebetween.

11. The semiconductor device according to claim 10, wherein the first substrate and the second substrate are disposed such that the first inductor and the second inductor are overlapped with each other.

12. The semiconductor device according to claim 10, wherein the bonding pad is located at a region where the tape material is not formed.

13. The semiconductor device according to claim 10, wherein the tape material is formed between the first and second inductors.

14. The semiconductor device according to claim 10, further comprising a bonding wire, wherein the bonding wire is connected with the bonding pad.

* * * * *